(12) United States Patent
Tudhope et al.

(10) Patent No.: US 8,105,660 B2
(45) Date of Patent: *Jan. 31, 2012

(54) METHOD FOR PRODUCING DIAMOND-LIKE CARBON COATINGS USING PECVD AND DIAMONDOID PRECURSORS ON INTERNAL SURFACES OF A HOLLOW COMPONENT

(76) Inventors: Andrew W Tudhope, Danville, CA (US); William J Boardman, Danville, CA (US); Steven F Sciamanna, Orinda, CA (US); Thomas B Casserly, San Ramon, CA (US); Robert M Carlson, Petaluma, CA (US)

( * ) Notice: Subject to any disclaimer, the term of this patent is extended or adjusted under 35 U.S.C. 154(b) by 879 days.

This patent is subject to a terminal disclaimer.

(21) Appl. No.: 12/113,256

(22) Filed: May 1, 2008

(65) Prior Publication Data
US 2009/0176035 A1 Jul. 9, 2009

Related U.S. Application Data

(60) Provisional application No. 60/946,911, filed on Jun. 28, 2007.

(51) Int. Cl.
*B05D 7/22* (2006.01)
*H05H 1/24* (2006.01)

(52) U.S. Cl. ........ 427/570; 427/577; 427/237; 427/238; 427/249.7

(58) Field of Classification Search .................. 427/570, 427/577, 294, 237, 238, 249.7
See application file for complete search history.

(56) References Cited

U.S. PATENT DOCUMENTS

| | | | |
|---|---|---|---|
| 3,457,318 A | 7/1969 | Capaldi et al. | |
| 3,832,332 A | 8/1974 | Thompson et al. | |
| 4,022,845 A * | 5/1977 | Honna et al. | 585/366 |
| 5,017,734 A | 5/1991 | Baum et al. | |
| 5,397,558 A * | 3/1995 | Miyanaga et al. | 423/446 |
| 5,569,501 A | 10/1996 | Bailey et al. | |
| 5,786,068 A | 7/1998 | Dorfman et al. | |
| 6,740,393 B1 | 5/2004 | Massler et al. | |
| 7,165,830 B2 | 1/2007 | Miller, Jr. | |
| 7,224,532 B2 * | 5/2007 | Dahl et al. | 359/642 |
| 2002/0130407 A1 * | 9/2002 | Dahl et al. | 257/712 |
| 2004/0157059 A1 * | 8/2004 | Hayashi | 428/408 |
| 2005/0253901 A1 * | 11/2005 | Miller, Jr. | 347/64 |
| 2006/0011468 A1 | 1/2006 | Boardman et al. | |
| 2006/0196419 A1 * | 9/2006 | Tudhope et al. | 118/715 |
| 2006/0228479 A1 * | 10/2006 | Dahl et al. | 427/249.8 |
| 2009/0029067 A1 * | 1/2009 | Sciamanna et al. | 427/577 |

FOREIGN PATENT DOCUMENTS

EP 0763144 B1 8/2001

OTHER PUBLICATIONS

Tiwari, Rajanish, et al., "Chemical Precursor for the Synthesis of Diamond Films at Low Temperature". Applied Physics Express 3 (2010) 045501, pp. 1-3.*

* cited by examiner

*Primary Examiner* — Bret Chen
(74) *Attorney, Agent, or Firm* — Schneck & Schneck

(57) ABSTRACT

A method of forming a diamond-like carbon coating by plasma enhanced chemical vapor deposition on an internal surface of a hollow component having an inner surface. A reduced atmospheric pressure is created within a pipe or other hollow component to be treated. A diamondoid precursor gas is introduced to the interior of the component. A bias voltage is established between a first electrode and one or more second electrodes. The first electrode is or is attached to the component. The second electrode is externally offset from an opening of the component, by a hollow insulator. A plasma region is established adjacent an inner surface of the component and extends through the hollow insulator. The precursor gas comprises at least one diamondoid. The pressure and bias voltage are selected such as to cause the deposition of diamond-like carbon on the inner surface.

18 Claims, 8 Drawing Sheets

EXTERNAL DATA – FIG 4

| Pressure (mTorr) | Power (W) | Bias (V) | Diamondoid (CCM) | Ar (SCCM) | Hardness (Gpa) | Thickness (μ) | Dep. Rate (μm/min) | Dep. Rate (μm/hr) | Scratch (N) | HF1-6 Adhesion (N) | Comment |
|---|---|---|---|---|---|---|---|---|---|---|---|
| 200 | 10 | 600 | 0.0500 | 50 | 5.8 | 3.7 | 0.0925 | 5.55 | 4.0 | 6 | |
| 50 | 20 | 600 | 0.0500 | 50 | 7.2 | 3.0 | 0.0750 | 4.50 | 6.7 | 6 | |
| 50 | 10 | 1000 | 0.0500 | 50 | 18.0 | 2.6 | 0.0650 | 3.90 | 9.5 | 5 | |
| 200 | 20 | 1000 | 0.0500 | 50 | 7.7 | 9.0 | 0.2250 | 13.50 | 8.5 | 6 | |
| 50 | 10 | 600 | 0.0750 | 50 | 10.5 | 2.8 | 0.0700 | 4.20 | 6.5 | 6 | |
| 200 | 20 | 600 | 0.0750 | 50 | 4.5 | 5.0 | 0.1250 | 7.50 | 8.2 | 6 | |
| 200 | 10 | 1000 | 0.0750 | 50 | 7.1 | 9.0 | 0.2250 | 13.50 | 9.4 | 6 | |
| 50 | 20 | 1000 | 0.0750 | 50 | 15.3 | 3.6 | 0.0900 | 5.40 | 5.8 | 6 | |
| 125 | 0 | 600 | 0.0625 | 125 | 10.2 | 2.0 | 0.0500 | 3.00 | 4.4 | 6 | |
| 125 | 15 | 800 | 0.0625 | 125 | 14.5 | 2.9 | 0.0725 | 4.35 | 4.9 | 6 | |
| 125 | 0 | 1000 | 0.0625 | 125 | 23.0 | 2.1 | 0.0525 | 3.15 | 6.5 | 6 | |
| 50 | 10 | 600 | 0.0500 | 200 | 16.3 | 1.8 | 0.0450 | 2.70 | 12.2 | 4 | |
| 200 | 20 | 600 | 0.0500 | 200 | 14.3 | 3.5 | 0.0875 | 5.25 | 5.0 | 6 | |
| 200 | 10 | 1000 | 0.0500 | 200 | 23.6 | 4.7 | 0.1175 | 7.05 | 5.3 | 6 | Hard + High Dep. Rate EXAMPLE A |
| 50 | 20 | 1000 | 0.0500 | 200 | 16.2 | 2.7 | 0.0675 | 4.05 | 6.9 | 6 | Ductile EXAMPLE B |
| 200 | 10 | 600 | 0.0750 | 200 | 11.3 | 2.0 | 0.0500 | 3.00 | 14.8 | 3 | Hard EXAMPLE C |
| 50 | 20 | 600 | 0.0750 | 200 | 8.4 | 2.5 | 0.0625 | 3.75 | 5.5 | 6 | |
| 50 | 10 | 1000 | 0.0750 | 200 | 17.5 | 1.7 | 0.0425 | 2.55 | 8.7 | 6 | |
| 50 | 20 | 1000 | 0.0750 | 200 | 11.3 | 2.5 | 0.0625 | 3.75 | 5.3 | 6 | |
| 200 | 20 | 1000 | 0.0750 | 200 | 20.0 | 5.4 | 0.1350 | 8.10 | 6.2 | 6 | |
| 200 | | 2000 | 0.0500 | 175 | 31.1 | | 0.0767 | 4.60 | | | Hard EXAMPLE D |
| 20 | | 1500 | 0.0500 | 200 | 35 | 2 | 0.0500 | 3.00 | 3.0 | | Hard Example E |

INTERNAL STANDARD CONDITIONS = DMA - 0.2ccm~24Sccm with 90sccm of Ar as carrier gas on 1.5"x12" SS 316 pipe
NZC-DMA-30min of Cap
Adh (Z4MS) Thickness - 2.75 microns

| %C2H2 | % DMA | Process Conditions | Voltage for DMA layer | Power (w) | Pressure (mTorr) | Run No. | Total Thickness (μm) | Dep. Rate of DMA(μm/min) | Dep Rate (um/hr) | Hardness (Gpa) | Adhesion (N) | Scratch Index (N/μm) | Wear rate&COF-2N/Bentonite | Comments |
|---|---|---|---|---|---|---|---|---|---|---|---|---|---|---|
| 0 | 100 | STANDARD | 680V | 75 | 50 | 011608-2-3 | 7 | 0.142 | 8.500 | 15 | 5.9 | 84.3 | 2.8 x 10⁻⁶ / 0.03 | |
| 0 | 100 | STANDARD | 760V | 75 | 300 | 011608-3-3 | 7.5 | 0.158 | 9.500 | 4 | 8.5 | 113.3 | Pass 8.8 x 10⁻⁶ / 0.06 | |
| 0 | 100 | STANDARD | 720V | 145 | 50 | 011708-1-3 | 6.6 | 0.128 | 7.700 | 18.1 | 6.1 | 92.4 | | |
| 0 | 100 | STANDARD | 740V | 145 | 175 | 011708-4-3 | 6.1 | 0.112 | 6.700 | 13.1 | 5.5 | 90.2 | | |
| 0 | 100 | STANDARD | 820V | 145 | 300 | 011708-2-3 | 9.1 | 0.212 | 12.700 | 5.8 | 7.6 | 83.5 | 3.12 x 10⁻⁶/0.06 | |
| 0 | 100 | STANDARD | 780V | 187.5 | 175 | 011508-1-3 | 13.5 | 0.358 | 21.500 | 16.8 | 12.1 | 89.6 | | |
| 0 | 100 | STANDARD | 700V | 187.5 | 70 | 011708-3-3 | 10.4 | 0.255 | 15.300 | 12.5 | 7.7 | 74.0 | 1.31 x 10⁻⁶/0.04 | |
| 0 | 100 | STANDARD | 720V | 215 | 50 | 011608-5-3 | 11.6 | 0.295 | 17.700 | 21.5 | 10.7 | 92.2 | 1.54 x 10⁻⁶/0.06 | |
| 0 | 100 | STANDARD | 760V | 215 | 175 | 011808-1-3 | 14.7 | 0.398 | 23.900 | 16.9 | 12.3 | 83.7 | | EXAMPLE G |
| 0 | 100 | STANDARD | 800V | 215 | 300 | 011608-6-3 | 13.5 | 0.358 | 21.500 | 24.2 | 14.5 | 107.4 | | EXAMPLE F |
| 100 | 0 | with 24 sccm C2H2 | 580V | 215 | 300 | 032708-1_19 | 9.2 | 0.215 | 12.900 | 20.9 | 7 | 76.1 | | |
| 0 | 100 | 10 min CAP | 840V | 215 | 300 | 012108-1-3 | 7.8 | 0.505 | 30.300 | 17.3 | 7 | 89.7 | | |
| 90 | 10 | 10%DMA+90% C2H2 | 760V | 215 | 300 | 012108-2-3 | 16 | 0.442 | 26.500 | 16.5 | 15.4 | 96.3 | | |
| 0 | 100 | DMA - 0.4 ccm | 840V | 215 | 300 | 011808-3-3 | 14.7 | 0.398 | 23.900 | 19 | 13.2 | 89.8 | | |
| 0 | 100 | STANDARD | 840V | 215 | 450 | 011808-2_3 | 15.5 | 0.425 | 25.500 | 21.2 | 15.4 | 99.4 | | |
| 0 | 100 | STANDARD | 740V | 300 | 50 | 011608-4-3 | 9.6 | 0.228 | 13.700 | 15.8 | 8.4 | 87.5 | 0.08 | |

FIG 6

| INTERNAL | STANDARD CONDITIONS = | | | DMD - 0.15ccm~16Sccm with 90sccm of Ar as carrier gas NZC-DMD-30min of Cap Adh (Z4MS) Thickness - 2.75 microns | | | | | | | |
|---|---|---|---|---|---|---|---|---|---|---|---|
| Bias Voltage | Process Conditions | Power (watts) | Pressure (mTorr) | Run No. | Thickness | Dep. Rate of DMA | Hardness | Adhesion | Scratch Index | Wear - 2N - Bentonite | Comments |
| 660V | STANDARD | 75 | 50 | 011708-5-3 | 8.4 | 0.188 | 9.8 | 7.9 | 94.0 | Pass/2.58 x $10^{-6}$ / 0.09 | EXAMPLE H |

FIG 7

| P mTorr | Bias V | Diamondoid % | Diamondoid ccm | Diamondoid sccm | C2H2 % | C2H2 sccm | Ar sccm | Thickness μ | Hardness Gpa | Dep rate μ/hr |
|---|---|---|---|---|---|---|---|---|---|---|
| 200 | 1000 | 0 | 0 | 0 | 100 | 6 | 150 | 1.6 | | 2.4 |
| 200 | 1000 | 10 | 0.005 | 0.6 | 90 | 5.4 | 150 | 2.4 | | 3.6 |
| 200 | 1000 | 15 | 0.0075 | 0.9 | 85 | 5.1 | 150 | 2 | | 3 |
| 200 | 1000 | 20 | 0.01 | 1.2 | 80 | 4.8 | 150 | 2.1 | | 3.15 |
| 200 | 1000 | 50 | 0.025 | 3 | 50 | 3 | 150 | 2.8 | | 4.2 |
| 200 | 1000 | 80 | 0.04 | 4.8 | 20 | 1.2 | 150 | 4 | 20.9 | 6 |
| 200 | 1000 | 90 | 0.045 | 5.4 | 10 | 0.6 | 150 | 3.4 | 20.4 | 5.1 |
| 200 | 1000 | 100 | 0.05 | 6 | 0 | 0 | 150 | 4 | 29.3 | 6 |

METHOD FOR PRODUCING DIAMOND-LIKE CARBON COATINGS USING PECVD AND DIAMONDOID PRECURSORS ON INTERNAL SURFACES OF A HOLLOW COMPONENT

TECHNICAL FIELD

The present invention relates to the deposition of carbon based coatings onto the surfaces of articles and relates particularly, but not exclusively, to the deposition of such coatings onto metallic surfaces such as, for example an internal surface of a pipe or the like.

The invention relates generally to deposition of diamond-like carbon (DLC) by plasma enhanced chemical vapor deposition and to methods of forming DLC based coatings on internal surfaces using diamondoids. This method allows adjustment of tribological and mechanical properties, such as hardness, Young's modulus, wear resistance and coefficient of friction and optical properties, such as refractive index. In addition the resulting coatings are uniform and have high corrosion resistance. By controlling pressure, type of diamondoid precursor and bias voltage, the new method prevents the diamondoid precursor from fully breaking upon impact with the substrate. The diamondoid retains $sp^3$ bonds which yields a high $sp^3$ content film at higher pressure. This enables a faster deposition rate than would be possible without the use of a diamondoid precursor.

BACKGROUND ART

The corrosion of industrial piping and other components such as valves and pumps is a major problem in some industries. The oil industry, in particular, faces severely corrosive environments, with corrosive gasses and liquids such as $H_2S$ (hydrogen sulfide) at elevated temperatures and pressures. Additionally, these conditions form severe wear and erosion environments. One solution to these issues is to coat a lower grade base material with a high quality coating material having the desired high corrosion and wear-resistant properties. Typically, these types of properties will be found in metal, ceramic and particularly diamond-like carbon coatings.

Expensive specialty alloys, such as HASTELLOY and INCONEL (both of which are federally registered trademarks of Huntington Alloys Corporation), are commonly used for exhaust piping in the chemical processing industries. These alloys exhibit high temperature strength and corrosion resistance. Again, a less expensive base material can be used if a suitable surface coating is applied to the interior surface that is to be exposed to the corrosive environment.

Prior art coating methods for formation of diamond-like carbon include chemical vapor deposition (CVD), and physical vapor deposition (PVD) methods. Many of the desirable properties of DLC are determined by the amount of diamond bonding ($sp^3$) compared to graphite bonding ($sp^2$) of the carbon. By expanding the $sp^3/sp^2$ ratio it is possible to achieve many of the excellent properties of diamond such as high hardness, low coefficient of friction, low wear, high Young's modulus, chemical inertness, etc.

Composite coatings based on DLC have also been shown to have desirable properties. For example layered films using a material of low modulus followed by a material of high hardness such as WC/C has been shown to increase wear resistance. Similarly, a so called "nano-composite" can be used. A nano-composite is formed by mixing the materials instead of layering, so that nano-sized crystals of a very hard material (e.g. TiN) are embedded in the amorphous DLC matrix. A nano-composite can also involve two or more different amorphous matrixes, such as a C—H matrix and separate metal-metal matrix as described in U.S. Pat. No. 5,786,068 to Dorfman et al. In the prior art, these types of films have not been produced with good results with purely PECVD techniques, but only by PVD or hybrid PVD/PECVD methods.

In the case of applications using piping, valves, pumps or tubing for carrying corrosive material, such as the oil/petrochemical industry, the interior surface that is in contact with the corrosive material must be coated. For very low pressure techniques such as PVD, where the pressure is below or near the molecular flow region, coating interior surfaces has been limited to only large diameter and short length (large aspect ratio) tubes. DLCs made using PVD techniques can be produced by sputtering off a graphite target using an Ar plasma. An a-C:H DLC (amorphous hydrogen-containing DLC) can be produced by reactive sputtering by adding a hydrogen background gas. Very high $sp^3$ content DLCs called tetrahedral carbon (ta-C) can be produced using cathodic arc off of a graphite target, due to the very high ionization (~100%). However, PVD techniques are not practical for coating of internal surfaces, particularly with diameters less than six inches, due to being a line-of-sight process.

Prior art PECVD of DLC based coatings rely on ion bombardment energy to form $sp^3$ bonds. Without this, graphite will form instead of diamond. It has been found that approximately 100 eV of energy on the $C^+$ ion is needed to maximize the $sp^3$ content. This carbon ion energy is a function of bias voltage, pressure, precursor gas and plasma density. High plasma density, low pressure (<1e-3 torr) PECVD techniques such as ECR (electron cyclotron resonance) have generated the highest $sp^3$ content PECVD films, with reports of up to 70% $sp^3$ content. Because these processes are limited to low pressure the deposition rate is very slow (~1 μm/hr). Prior art precursors are hydrocarbons, such as methane, acetylene and benzene. The precursor used to form the film will change the energy per carbon atom due to the breakup of the molecule on impact with the surface. Thus, a carbon atom produced from acetylene ($C_2H_2$) will have approximately one-half the energy of a carbon atom from methane ($CH_4$). Therefore, a higher bias voltage is required to produce high $sp^3$ content films if large precursor molecules are used. The use of a large precursor molecule can have negative effects, such as a larger thermal spike, which causes the $sp^3$ bond to relax back to graphite or $sp^2$. The formation of prior art DLC films is fully described in "Diamond-Like amorphous carbon," J. Robertson, *Materials Science and Engineering* R 37 (2002) pages 129-281; incorporated herein by reference. The commonly accepted model of DLC formation is referred to as the 'subplantation' model. This model states that for hydrocarbon precursors if the carbon atom arrives with a low energy (~<50 eV) it will form a high hydrogen content polymer, and if it arrives with moderate energy (~70 eV-120 eV) it will penetrate below the surface where it is held in compression and forms a $sp^3$ or tetrahedral bond, if the energy is increased further a 'thermal spike' will occur locally which allows the $sp^3$ bond to relax back to graphite or $sp^2$ bonding. These numbers are approximate for low pressure and $CH_4$ precursor, and will vary based on pressure and precursor size.

Plasma-enhanced CVD (PECVD) allows coating with reduced temperature, for a temperature-sensitive substrate, by supplying energy from the plasma instead of heat. The invention described herein relates to the PECVD technique, although it is also applicable to PVD processes. PECVD-produced DLCs will contain some hydrogen due to the use of hydrocarbon precursors. In comparison, DLCs made using PVD techniques have less hydrogen. However, as previously mentioned, PVD techniques are not practical for the coating of internal surfaces, particularly with diameters less than six inches. Higher pressure (>10 m Torr) PECVD techniques have the advantage of higher deposition rates, however with prior art techniques it is not possible to make high $sp^3$ content films due to the lack of a collision-less plasma sheath (the mean free path of the ion is less then the plasma sheath width) resulting in low ion energy, additionally the ion/radical ratio is lower at higher pressure. For high quality DLC's it is important to have a large portion of film deposition due to ion flux vs. non-ionized flux, due to the importance of ion bombardment energy. A high level of radicals vs. ions is detrimental to DLC properties, as radicals are highly reactive but lack the energy of ions. Since the ion/radical ratio decreases with increasing pressure prior art process were limited to low pressure for high $sp^3$ content films and were limited to the resulting low deposition rates.

Prior art PECVD techniques contained substantial amounts of hydrogen due to the hydrogen contained in the hydrocarbon precursor which is incorporated into the DLC. This hydrogen has detrimental effects such as lowering the hardness and temperature stability of the coating.

The plasma immersion ion implantation and deposition (PIIID) technique has been shown to be useful for coating the external surfaces of complex shapes. PIIID is performed by applying a negative bias to the workpiece, which will pull positive ions toward the workpiece, if the plasma sheath is conformal. There are also improvements that can be made to film properties such as adhesion and film density via ion bombardment of the workpiece. Use has been made of high $sp^3$ seed material in prior art PECVD formation of carbon-coated barrier films. For example EP 0763 144 B1 uses a diamondoid precursor at very low concentration (<10%) compared to the concentration of a standard hydrocarbon precursor such as acetylene. Internal DLC coatings are not commonly done in the prior art. The deposition of external DLC coatings is well described in Massler (U.S. Pat. No. 6,740,393), this coating description includes an adhesion layer, gradient layer and DLC top coating. One of the advantages taught by Massler is a high deposition rate process preferably in the range from 1-4 microns/hour at a pressure from $10^{-3}$ to $10^{-2}$ mbar (0.75-7.5 m Torr), the maximum hardness given in the examples taught by Massler is 2,500 HK. In comparison the present invention achieves a much higher deposition rate with high hardness and a higher operational pressure. However in the prior art the ability to control film properties is limited by both the low concentration of diamondoid and the inability to control ion bombardment energy and was limited in application to gas permeation barriers. A comparison of prior art (Massler) and the present invention process parameters are shown below:

| Process Parameters | Massler (Example 2) | Invention (Example F) INTERNAL |
|---|---|---|
| Pressure (mtorr) | 0.75-7.5 | 300 |
| Argon flow (sccm) | 50 | 90 |
| Acetylene flow (sccm) | 350 | |
| Adamantane flow (liquid ccm) | 0 | 0.2 |
| Voltage (V) | 700 | 800 |
| Power (DC Watts) | | 215 |
| Magnets | Yes | No |
| Deposition rate (μm/hr) | 1.5 | 21.50 |
| Hardness (GPa) | 25 | 24.2 |

The above is an example of the process and does not limit the range of the invention, for example the process can be optimized to provide a higher hardness then the above at a somewhat lower deposition rate or it can be optimized to provide a high deposition rate with a lower hardness.

Higher pressure (>10 mTorr) PECVD techniques have the advantage of higher deposition rates, however with prior art techniques it is not possible to make high $sp^3$ content films due to the lack of a collision-less plasma sheath. This means that the mean free path of the ion is less than that of the plasma sheath width, resulting in low ion energy. Additionally, the ratio of (free) radicals to ions is higher at high pressure which results in $sp^2$ rich films. A high level of radicals vs. ions is detrimental to DLC properties, as radicals are highly reactive but lack the energy of ions. To form high quality DLC it is important to have a large portion of film deposition due to ion flux vs. non-ionized (or radical) flux, due to the importance of ion bombardment energy. Since the ion/radical ratio decreases with increasing pressure, prior art processes for $sp^3$ formation were limited to low pressure, and the resulting low deposition rates that go along with low pressure.

There is a trend in increasing hardness with increasing saturation, or $sp^3$ bonding, of the precursor molecule. This is because molecules such as acetylene with two pi bonds are more likely to form reactive radicals then a molecule such as methane with $sp^3$ bonding or no pi bonds. Thus a higher hardness film is produced by methane then acetylene, conversely due to the higher radical reactivity the acetylene based coating will have a higher deposition rate then the methane based coating.

Most prior art precursors are hydrocarbons such as methane, acetylene and benzene. The precursor used to form the film will change the carbon energy due to the breakup of the molecule on impact with the surface. Thus a carbon atom produced from acetylene ($C_2H_2$) will have approximately one-half the energy of a carbon atom from methane ($CH_4$). Therefore a high bias voltage is normally required to produce high $sp^3$ content films when larger precursor molecules are used. The use of a large hydrocarbon precursor can also have negative effects, such as a large thermal spike.

Prior art PECVD techniques contained substantial amounts of hydrogen due to the hydrogen contained in the hydrocarbon precursor which is incorporated into the DLC. This hydrogen has detrimental effects such as lowering the hardness and temperature stability of the coating.

Compared to CVD techniques, PECVD allows coating at lower temperature because the energy is supplied by the plasma rather than heat. This is important in the instance where the substrate is temperature-sensitive.

Plasma immersion ion implantation and deposition (PIID) techniques have been shown to be useful for coating the external surfaces of complex shapes. PIID is performed by applying a negative bias to a workpiece, and this bias will pull positive ions toward the workpiece if the plasma sheath is conformal. There are also improvements that can be made to film properties such as adhesion and film density via ion bombardment of the workpiece.

Use has been made of high $sp^3$ seed material in prior art PECVD formation of carbon-coated $O_2$ barrier films on plastic materials. For example, EP 0763 144 B1 uses a diamondoid precursor at very low concentration (<10%) compared to the concentration of a standard hydrocarbon precursor such as acetylene. In the prior art, however, the ability to control film properties is limited by both the low concentration of diamondoid and the inability to control ion bombardment energy.

Diamondoids of the adamantane series are hydrocarbons composed of fused cyclohexane rings which form interlocking cage structures that are very stable. The lower diamondoids have chemical formulas of $C_{4n+6}H_{4n+12}$ where n is the number of cage structures. A complete description of these materials can be found in "Isolation and Structure of Higher Diamondoids, Nanometer-Sized Diamond Molecules" (Dahl, Liu & Carlson, Science, Jan. 2003, Vol. 299), which is incorporated herein by reference. The first three unsubstituted diamondoids are adamantane, diamantane and triamantane.

The term "diamondoids" refers to substituted and unsubstituted caged compounds of the adamantane series including adamantane, diamantane, triamantane, tetramantane, pentamantane, hexamantane, heptamantane, octamantane, nonamantane, decamantane, undecamantane, and the like, including all isomers and stereoisomers thereof. The compounds have a "diamondoid" topology, which means their carbon atom arrangement is superimposable on a fragment of an FCC diamond lattice. Substituted diamondoids comprise from 1 to 10 and preferably 1 to 4 independently-selected alkyl substituents. Diamondoids include "lower diamondoids" and "higher diamondoids.

The term "lower diamondoids refers to adamantane, diamantane and triamantane and any and/or all unsubstituted and substituted derivatives of adamantane, diamantane and triamantane. These unsubstituted lower diamondoid components show no isomers or chirality and are readily synthesized, distinguishing them from "higher diamondoids."

The term "higher diamondoids" refers to any and/or all substituted and unsubstituted tetramantane components; to any and/or all substituted and unsubstituted pentamantane components; to any and/or all substituted and unsubstituted hexamantane components; to any and/or all substituted and unsubstituted heptamantane components; to any and/or all substituted and unsubstituted octamantane components; to any and/or all substituted and unsubstituted nonamantane components; to any and/or all substituted and unsubstituted decamantane components; to any and/or all substituted and unsubstituted undecamantane components; as well as mixtures of the above and isomers and stereoisomers of tetramantane, pentamantane, hexamantane, heptamantane, octamantane, nonamantane, decamantane, and undecamantane. Adamantane chemistry has been reviewed by Fort, Jr. et al. in "Adamantane: Consequences of the Diamondoid Structure," Chem. Rev. vol. 64, pp. 277-300 (1964). Adamantane is the smallest member of the diamondoid series and may be thought of as a single cage crystalline subunit. Diamantane contains two subunits, triamantane three, tetramantane four, and so on. While there is only one isomeric form of adamantane, diamantane, and triamantane, there are four different isomers of tetramantane (two of which represent an enantiomeric pair), i.e., four different possible ways of arranging the four adamantane subunits. The number of possible isomers increases non-linearly with each higher member of the diamondoid series, pentamantane, hexamantane, heptamantane, octamantane, nonamantane, decamantane, etc.

Adamantane, which is commercially available, has been studied extensively. The studies have been directed toward a number of areas, such as thermodynamic stability, functionalization, and the properties of adamantane-containing materials. For instance, the following patents discuss materials comprising adamantane subunits: U.S. Pat. No. 3,457,318 teaches the preparation of polymers from alkenyl adamantanes; U.S. Pat. No. 3,832,332 teaches a polyamide polymer forms from alkyladamantane diamine; U.S. Pat. No. 5,017,734 discusses the formation of thermally stable resins from adamantane derivatives; and U.S. Pat. No. 6,235,851 reports the synthesis and polymerization of a variety of adamantane derivatives. The use of lower diamondoid moieties in conventional polymers is known to impart superior thermal stability and mechanical properties.

The coating of internal pipe surfaces has previously been disclosed in U.S Patent Application Pub. No. 20060011468, the method involves using the pipe itself as a vacuum chamber, coupling the gas supply to one opening and the vacuum pump to another, a voltage biasing system is connected with the negative terminal attached to the pipe and with return anode(s) located at the ends of the pipe. Hydrocarbon precursors can be introduced and the voltage biasing system is used to generate a high density hollow cathode plasma and attract hydrocarbon ions to the surface to from a DLC film.

SUMMARY OF THE INVENTION

The invention described herein relates to the PECVD technique when employed with a "hollow cathode" and may also be applicable to the PVD process and relates to the application of coatings to the internal surfaces of hollow components.

A method in accordance to the present invention allows production of high $sp^3$ content DLC coatings deposited by PECVD and possibly PVD techniques on internal surfaces with desirable properties such as, uniform film properties, good tribological and mechanical properties such as; high hardness and high Young's modulus, low wear and low friction, as well as chemical and corrosion inertness and low hydrogen content. Additionally a high $sp^3$ content DLC can be formed based on a new method of DLC film formation. By controlling pressure, type of diamondoid precursor and bias voltage, the new method prevents the destruction of the diamond-cage structure inherent in the diamondoid precursors upon their impact with the substrate surface. The diamondoid retains $sp^3$ bonds in a tight carbon cluster which yields a high $sp^3$ content film at higher pressure. This enables the formation of a higher $sp^3$ content film at higher deposition rate, and higher pressure than would be possible without the use of a diamondoid precursor.

It is contemplated that composites formed by the process described herein are novel. It is further contemplated that films and/or coatings defined by the process are also novel.

According to one aspect of the present invention there is provided a method of forming a diamond-like carbon coating on an internal surface of a hollow component having an inner surface by plasma enhanced chemical vapor deposition, the method comprising a steps of: creating a reduced atmospheric pressure within a component to be treated; introducing a diamondoid precursor gas to the interior of said component; establishing a bias voltage between a first electrode and a second electrode; and establishing a plasma region adjacent an interior surface of said component; wherein, said diamondoid precursor gas contains diamondoids of the adamantane series and said pressure and bias voltage are above 20 mTorr and 500V such as to cause the deposition of diamond-like carbon on said surface.

According to another aspect of the present invention there is provided a method of forming a diamond-like carbon coating on an internal surface of a hollow component having an inner surface by plasma enhanced chemical vapor deposition, the method comprising a steps of: creating a reduced atmospheric pressure within a component to be treated; introducing a diamondoid precursor gas to the interior of said component; establishing a bias voltage between a first electrode and a second electrode; and establishing a plasma region adjacent an interior surface of said component; wherein, said diamondoid precursor gas contains diamondoids of the adamantane series and said pressure and bias voltage are selected such as to cause the deposition of diamond-like carbon on said surface.

According to further aspect of the present invention there is provided a method of forming a diamond-like carbon coating on an internal surface of a hollow component having an inner surface by plasma enhanced chemical vapor deposition comprising a steps of: creating a reduced atmospheric pressure within a component to be treated; introducing a diamondoid precursor gas to the interior of said component; establishing a bias voltage between a first electrode and a second electrode; and establishing a plasma region adjacent an interior surface of said component; wherein, said diamondoid precursor gas contains diamondoids of the adamantane series and said pressure and bias voltage are above 20 m Torr and 500V such as to cause the deposition of diamond-like carbon on said surface.

Preferably, the plasma region is established as a "hollow cathode" effect plasma region, as well known in the art.

Each of the above may adopt one or more of the following steps or materials. For example, the precursor may be selected from the group comprising: adamantane, diamantane, triamantane and 1,3 diamethyl-adamantane and may be alkylated. The adamantane may be present as a percentage of between 10% and 100% in another reactive gas and the operating pressure may be selected to be between 20 mTorr and 300 mTorr and the bias voltage between 500V and 3000V. In some arrangements it may be desirable to including a step of introducing a hydrocarbon with the diamondoid precursor such as $C_2H_2$ or $C_4H_8$. Additionally, the method may include a step of adding a metal to the precursor, which may be tetrakisdimethylamino-titanium (TDMAT). The method may also include a step of layering diamondoid without any other reactive gas and other reactive gases with or without diaomondoid to form composite coatings and may include a step of adding a dopant to said diamondoid precursor which may be selected from the list comprising: $N_2$, silicon, germainium or a metal containing MOCVD precursor which may comprise TDMAT. The process may include a step of attaching said first electrode to a partially enclosed shape such as a pipe and biasing said partially enclosed shape as a cathode and biasing one or more second electrodes as anodes remote from the part, and wherein said component is a partially enclosed shape itself or said component is attached to an enclosed shape and establishing a hollow cathode plasma within said enclosed shape.

BRIEF DESCRIPTION OF THE DRAWINGS

FIG. 4 is a chart of data illustrating the finished coating properties for a plurality of process conditions when applied to an external coating process;

FIG. 6 is a chart of data illustrating the finished coating properties for a plurality of process conditions when using DMA and applied to an internal coating process;

FIG. 7 is a chart of data illustrating the finished coating properties for a process using DMD and applied to an internal coating process.

DETAILED DESCRIPTION

Figure 1:
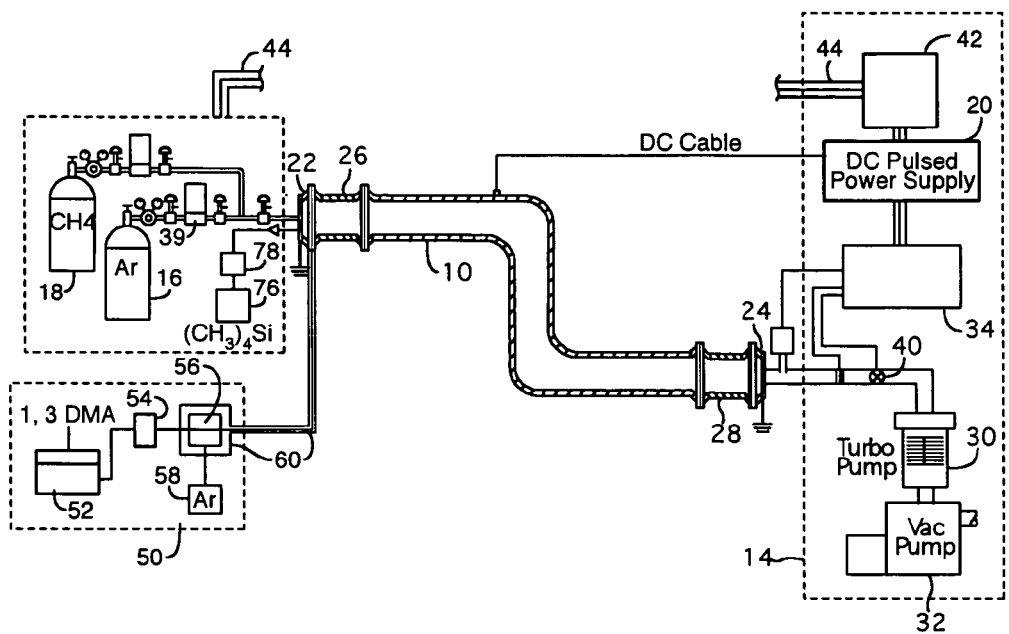
FIG. 1 is a block diagram of a system for use in carrying out the invention.

With reference to FIG. 1, a conductive pipe or "workpiece" 10 is connected to a pulsed DC power supply 20, which applies a pulsed negative bias. This negative bias is used to (a) create a plasma between first and second electrodes or a cathode and an anode formed as, for example, a preferred "hollow cathode" well known in the art and applied within the interior of a hollow workpiece, (b) draw an ionized reactive gas to the interior surfaces to be coated, (c) allow ion bombardment of the film applied to the interior surface to improve film properties such as density and stress levels, and (d) allow control of uniformity by adjusting the duty cycle so as to permit replenishment of a source gas and permit depletion of positive surface charge buildup, resulting from the coating process, during the "off" portion of the cycle, which can result in arcing on an insulating film such as DLC. The "hollow cathode effect" as used herein occurs when at least two cathode surfaces are positioned opposite to each other and are electrically cooperative with remote anodes, such that a large increase in current is achieved as compared to a conventional plasma glow. The increase is due to the "oscillation motion" of fast (hot, accelerated) electrons between the opposite space charge sheaths, which enhances the excitation and ionization rates in the plasma several orders higher than in the conventional glow discharge. Because this electron pendulum motion is related to the mean free path of the fast electrons, there is a relationship of the hollow cathode effect to pressure inside the hollow cathode and the spacing between the cathodes. That is, a hollow cathode with a smaller spacing will operate at a higher pressure than a hollow cathode with a larger spacing. It will, however, be appreciated that the process described herein may be adopted with plasma being generated adjacent the component to be treated which is not a "hollow cathode" type. Advantage is, however, gained by the employment of such a "hollow cathode".

To further improve charge dissipation a asymmetric bipolar pulse can be used, with a very small, short positive pulse applied to attract electrons and dissipate the positive charge, without forming a reverse plasma, resulting form the coating process during the "off" portion of the cycle. Here, the workpiece 10 functions as a cathode while anodes 22 and 24 are electrically isolated from the workpiece by insulators 26 and 28 and are connected to the positive side of the pulsed DC supply and can be grounded as shown, or can be floating. Pressure sensor 24 is located at each attachment head so that the pressure in the pipe can be monitored and controlled. The anodes are located near workpiece openings 14 and 16 and are physically and electrically isolated form the conductive workpiece and other functional subsystems by insulators. A gas supply subsystem 12 and pumping subsystem 32 are coupled to workpiece openings.

In a preferred arrangement, a diamondoid precursor is used to form a high $sp^3$ content DLC film on the interior of a conductive pipe using a PECVD process. A negative pulse bias is applied to the pipe, with the anodes placed at the ends of the pipe and grounded. In a desirable optional step the workpiece is sputter cleaned and an adhesion promoting layer is deposited as follows. The pipe is pumped to base pressure (~1 mTorr), and Ar is introduced into the workpiece 10 by MFC 39. An Ar plasma is generated when a negative pulse bias is applied to the pipe. This negative bias causes ion bombardment and sputter cleaning of the pipe surface. Following the Ar cleaning, a silicon containing adhesion layer is deposited, such that a strong iron-silicide bond is formed to the steel substrate and a SiC bond is formed to the DLC coating when deposited. Tetramethylsilane is introduced via container 76 and MFC 78. Due to the high vapor pressure of this liquid, it can be introduced by the simpler vapor draw technique. In some cases it may be desirable to use a precursor other then silicon for the adhesion layer, if the metal substrate does not form a strong bond with silicon. The strength of the bond that is formed is indicated by a negative heat of formation of the compound, the larger the negative number the more readily the chemical bond will form thermodynamically.

Following the deposition of the adhesion layer, the diamondoid based DLC film is formed. This is done by injecting the diamondoid precursor vapor into the chamber. Preferred diamondoid precursors are liquid at standard conditions with a high enough vapor pressure to deliver to a vacuum chamber, these would include purified or mixtures of alkylated diamondoids, including alkylated adamantane, alkylated diamantane, alkylated triamantane, and the rest of the adamantane series. Preferred diamondoid precursors also include liquid mixtures of isomers of diamantane containing one or more alkyl groups.

Adamantane's ionization potential (IP) is reported as 9.25 eV in the NIST data base (National Institute of Standards, NIST Chemistry webbook, http://webbook.nist.gov/chemistry/). Other diamondoids have been calculated by Lu, et al. to show similar IP, ranging between 7 and 9 eV for diamondoids containing from 2 to 10 cages in "Electronic and Vibrational Properties of Diamond-like Hydrocarbons" Physical Review B 72, 035447 (2005). Unsubstituted diamondoids are readily ionized to both cations and radical cations in the plasma deposition chamber of this invention. Diamondoid cations are unusually stable and can remain intact during their acceleration to the negatively biased work piece surface. Diamondoid cation stability is demonstrated by unusually intense, positively charged molecular ions observed during mass spectral measurements as shown by Waltman and Ling in "Mass Spectrometry of Diamantane and Some Adamantane Derivatives" Canadian Journal of Chemistry, Volume 58, pages 2189 to 2195 (1980). Polfer, Sartakov and Oomens showed that diamondoid cations and diamondoid radical cations can survive for many hundreds of milliseconds in vacuum in "The Infrared Spectrum of the Adamantyl Cation" in Chemical Physics Letters, Volume 400, pages 201 to 205 (2004). It has been found from mass spectral analysis that cations formed from alkylated diamondoids are predominately radical cations. The radical diamondoid cations are formed through the loss of the alkyl group as a neutral species, and the intact diamondoid cage structure retains the charge. A radical diamondoid cation has one hydrogen atom less than a diamondoid cation, which results in a coating with less hydrogen content. In addition, the radical diamondoid cations can cross link with each other at the surface more readily than diamondoid cations can cross link.

If diamondoid cations or radical diamondoid cations are accelerated to the workpiece with too great a velocity, destruction of their cage structure is possible. However, this invention makes it possible to adjust cation energies using a range of bias voltages and pressures to minimize (or maximize) such destruction.

A preferred diamondoid precursor is 1,3 dimethyl adamantane. Though purified adamantane is a solid, this substituted form of adamantane is a liquid at room temperature conditions. 1,3 dimethyl adamantane has been found to give high $sp^3$ content, uniform film properties, low hydrogen content and fast deposition rate in the range of process pressures 10 mTorr to 1 Torr. The liquid can be delivered to the workpiece by either of the known techniques of bubbling or direct liquid injection (DLI). The preferred method shown in FIG. 1 is a DLI system 50. The dimethyladamantane (DMA) is stored in a pressurized canister 52, a small measured amount of liquid (e.g., 0.5 cm$^3$/min) is injected from the liquid flow controller 54 into an evaporation chamber 56. Heating coils 60 heat the solution to a temperature exceeding the boiling point of the 1,3 dimethyl adamantane solution at 100 mTorr (e.g., 100° C.). A carrier gas such as $N_2$ or Ar 58 is also introduced. Any diamondoid precursor delivery line or other component between the evaporator and the pipe must also be heated to prevent condensation.

The pressure is set using pressure control valve 40 to generate a hollow cathode effect (HCE) plasma for a given diameter pipe, and the diamondoid precursor is selected to prevent complete breakup of the precursor on impact with the substrate in combination with the applied bias voltage and pressure. For example, for a 1.5 inch diameter pipe, a high intensity hollow cathode plasma is generated at 100-300 mTorr with an applied bias of 650V, The pressure setting should be such that the pressure inside the workpiece 10 establishes a condition in which the electron mean free path is related to the inner diameter of the workpiece, such that the electron has enough energy to reach the opposing cathode sheath and be reflected back, causing electron oscillation and increased ionizing collisions by the "hollow cathode" effect. Thus, a more intense plasma is generated within the workpiece. Since the electron mean free path increases as the pressure decreases, it is necessary to decrease pressure as the pipe diameter increases. For example, a quarter inch (6.35 millimeter) diameter gasline will generate a hollow cathode plasma at a pressure of approximately 200-500 mTorr, while a four inch (101.6 millimeter) diameter pump exhaust duct would generate a plasma at a pressure of approximately 12-100 mTorr. These are intended to be approximate values to show the general trend of lower pressure with larger diameter, but the pressure range can vary significantly from these values and still maintain a hollow cathode plasma.

The degree of ionization or plasma intensity is important for the PIIID technique to be effective, since it is only the ionized gas that is accelerated across the plasma sheath into the workpiece. The hollow cathode effect provides a more intense plasma than is otherwise available in DC or RF plasmas. This increase in intensity is available without the complications of other means of generating intense plasmas, such as magnets or microwave plasma sources which would be very difficult to implement for internal surfaces. This high density plasma has several advantages: high deposition rate; thin conformal plasma sheath allowing conformal coating over complex geometries; and better ion energy control due to fewer ion collisions across the thinner plasma sheath. The process also eliminates the need for separate heating of the workpiece 10. Optical and langmuir probes can be located at the anode end connections to monitor when the intense hollow cathode is properly generated The duty cycle and power limit should be set to obtain the proper heating of the pipe. The duty cycle can also be used to allow replenishment of the gas as it flows through the pipe.

Many of the diamondoid forms exist as solids at standard conditions, these can be delivered by heating the solid so that sufficient vapor is generated by sublimation, again a carrier gas can be used to increase the delivery pressure, and all downstream delivery lines should be heated.

This novel improved method includes using a combination of pressure, size of diamondoid precursor, and bias voltage so that the diamondoid precursor does not fully breakup on impact with the substrate but remains with partially intact $sp^3$ bonds. For the bonds to remain partially intact ion energy per carbon atom must be controlled to a low value. In the present invention the bias voltage cannot be reduced substantially below 400V since plasma generation and part bias are controlled by the same supply, and the plasma will extinguish if bias is reduced too much. Bias can be reduced to some degree by running at higher duty cycle, higher pressure, higher power or diluting with an easily ionized gas such as Argon.

Additionally ion energy per carbon atom can be reduced by increasing the pressure which causes ion collisions across the plasma sheath or by increasing the size of the precursor molecule. For example if 1,3 dimethyl adamantane is used as the precursor and the process pressure is set high enough (>100 mTorr) to result in collisions across the plasma sheath, then the ion energy on impact with the substrate will be greatly reduce from the applied bias voltage. If a low ion energy is controlled to using these techniques an optically clear, high refractive index, $sp^3$ bonded polymer with low hydrogen content is obtained and if moderate bias is used a hard DLC film can be obtained with low hydrogen content and high $sp^3$ content. The use of a higher pressure process also has the additional advantage of a higher deposition rate. Additionally the size or specifically the molecular weight of the diamondoid precursor can be used to control the ion energy, a larger diamondoid can be used to lower the energy per carbon atom. For example, diamantane ($C_{14}H_{20}$) can be substituted for adamantane ($C_{10}H_{16}$). These ion energy control techniques enables the formation of a higher $sp^3$ content film than would be possible without the use of a diamondoid precursor. It also enables a much higher deposition rate than smaller hydrocarbons such as acetylene due to the presence of many more carbon atoms per molecule, while still producing a high diamond bond film.

The advantages of using larger diamandoid molecules such as dimethyl-diamantine (which is the next largest diamondoid following dimethyl-adamantane) and dimethyl-triamantane (larger still following dimethyl-diamantine) include the following: 1) A continuing increase in deposition rate based on a larger number of carbon molecules per ion, or for each Amp of current delivered to the workpiece a larger number of $sp^3$ carbon atoms is delivered 2) a higher ratio of carbon/hydrogen is obtained 3) carbon energy per ion is controlled based on precursor molecule size, such that coating properties can be controlled, including forming high $sp^3$ clear polymer coatings requiring low bias. This is due to the fact that as the diamondoid molecule becomes larger, the energy per carbon atom decreases for a constant bias voltage 4) A larger ratio of $sp^3$ bonded carbon content within the coating should be obtained based on the high number of $sp^3$ carbon atoms delivered by the precursor compared to $sp^2$ bonding that may occur when joining precursor molecules together during film formation.

Due to the high ionization of the hollow cathode plasma, prior art precursors will increasingly fragment as they travel down the length of the pipe, also there are variations in plasma intensity down the length of the pipe that will also contribute to fragmentation of the precursor, the use of a diamondoid precursor will greatly reduce this fragmentation due to the high stability of the diamondoid cage structure, this in turn gives more uniform properties down the length of the pipe.

A further advantage of this method is that novel layered composite materials can be formed by varying the bias voltage, pressure or diamondoid precursor as previously described. Materials with layers of softer, tougher $sp^3$ polymer and layers of hard DLC are contemplated, thus forming a composite with a combination of the desirable properties of the combined layers. Using these techniques DLC properties can be varied from very hard, high $sp^3$ DLC with low hydrogen content to the tougher, high $sp^3$ content, hydrocarbon polymer.

An additional advantage of this method is that in the case of coating internal surfaces of pipes, a more uniform coating down the length of the pipe can be achieved. For prior art DLC precursors including hydrocarbons such as acetylene, methane and benzene the bonds between atoms within the molecule are not strong resulting in fragmentation of the precursor, the formation of radicals and ionized fragments of the parent precursor, this results in different plasma chemistry down the length of the pipe and thus variation in coating properties. For this case of a chemical precursor traveling down the length of a long pipe it is desirable that the precursor cation be stable and not break into fragments traveling down the pipe, which would result in different coating chemistry down the length of the pipe. Diamondoid precursors provide this stable cation, resulting in more uniform coating properties. Importantly due to the strong C—C cage structure bonding the structure does not fragment in the plasma to the degree that prior art precursors do, resulting in a high ion/radical ratio even at higher pressures.

Figure 2:
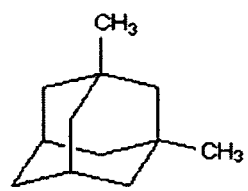
FIG. 2 is the structure of dimethyladamantane.

FIG. 2 shows the 1,3 dimethyladamantane molecule, here we can see that for an adamantane cage structure there are 4 'bridgehead' carbon atoms that are bonded by the strong tetrahedral bond to three other carbon atoms (in the case of dimethyladamantane 2 of these bridgehead carbons are also bonded to a methyl group, so they are bonded to four carbon atoms). There are six secondary carbon atoms that are bonded to 2 other carbon atoms and 2 hydrogens. Diamondoids are the only type of carbon molecule that contains this high degree of strong C—C tetrahedral bonds. This stable diamondoid ion is also of benefit in cases where plasma intensity changes down the length of the pipe, for example in the case of a small diameter pipe there will be a pressure drop from the gas inlet to the outlet to the pump, resulting in higher plasma density toward the higher pressure entry of the pipe, in the case of prior art precursors this would result in more fragmentation and different plasma chemistry toward the entry of the pipe, but this is not the case for the diamondoid precursor. Diamondoid precursors are also non-toxic and non-flammable.

In another embodiment of the invention, a hydrocarbon is added to the diamondoid precursor to promote bonding between the diamondoid fragments in the coating, the concentration of hydrocarbon added to the diamondoid precursor will not exceed 75 mol % of the total reactive gas. Preferably a plasma source capable of generating a high plasma density, such as ECR or hollow cathode, is used to promote high $sp^3$ content films. The addition of this type of hydrocarbon will produce a film with improved adhesion, lower stress and allow the deposition of a thicker film.

In a further embodiment of the invention molecular precursors containing elements other than hydrogen and carbon are added to the diamondoid to enhance properties, such as wear-resistance or conductivity. For example a metal-containing precursor such as tetrakisdimethylamino-titanium (TDMAT) can be added. In addition to forming various composite films with improved tribological or corrosion resistant properties, these elements can be used to lower the resistance of the film and thus produce a thicker film. The thickness of resistive films is inherently limited due to the drop in voltage across film, so that less power is applied to the plasma.

In another embodiment the method involves a PECVD process with the use of a "matrix-forming" material, such that a composite film is formed. For example, acetylene ($C_2H_2$) can be used as the "matrix-forming" material mixed with diamondoid precursor, so that high $sp^3$ DLC from the diamondoid precursor is mixed as a composite with lower $sp^3$ DLC from the acetylene. Additionally metal layers may be added by sputtering from a metal rod that is inserted down the center of the pipe. Other materials that can be used with a diamondoid precursor include $N_2$, silicon or metal containing MOCVD precursors, such as TDMAT. In addition to forming various composite films with improved tribological or corrosion resistant properties, these dopants can be used to lower the resistance of the film and thus produce a thicker film.

Figure 3:
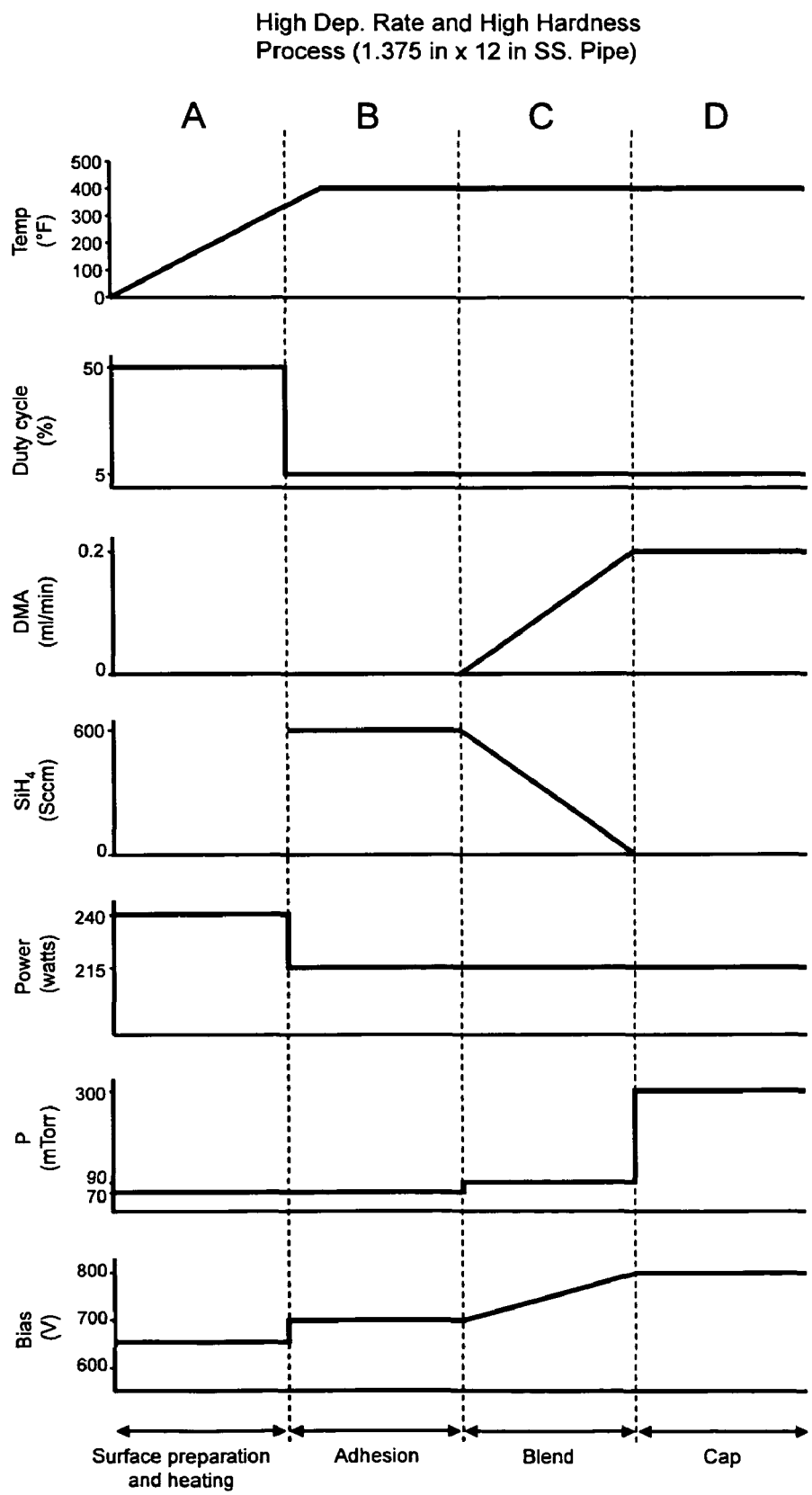
FIG. 3 is a diagrammatic representation of the process employed in accordance with the present invention.

FIG. 3 illustrates graphically the control and variation of the controllable parameters during an optimised treatment cycle. Other variations form this arrangement may be contemplated, particularly if it is desired to optimize for another parameter. From FIG. 3 it will be appreciated that an initial surface preparation and heating step A may be completed by employing a duty cycle of 50% and a power setting of 240 W at a pressure of 70 mTorr and a bias voltage of between 600 and 700 V. This should see the temperature rise to about 300° F. An adhesion step my be applied in step B and achieved by lowering the duty cycle to about 5% whilst introducing a $S_iH_4$ flow of about 600 sccm at a reduced power setting of 215 W, a pressure of 70 mTorr and a bias voltage of about 700 V. A blend step may be provided in step C and during which the diamondoid DMA flow is commenced and raised gradually to about 0.2 ml/min whilst reducing the $S_iH_4$ flow to zero over the same period and maintaining the power at 215 w and raising the bias voltage to 800 V and the pressure to 90 mTorr. The final step D comprises a cap layer deposition step during which the DMA flow is maintained at 0.2 ml/min, the power at 215 W and the bias voltage is raised to 800 V while the pressure is set to 300 mTorr.

FIG. 4 provides details of how the hardness, thickness, deposition rate, scratch resistance and adhesion properties vary as these controllable parameters are varied and from which it will be appreciated that the samples marked A, B, C and D make for good comparison. Example A provides a surface with a high hardness at 23.6 Gpa and a high deposition rate at 7.05 μm/hr. To achieve this, the pressure was 200 mTorr, the power was set at 10 W, the bias voltage at 1000V and a diamondoid flow of 0.05 ccm in an argon flow of 200 sccm was employed. Example A has superior properties to the Massler sample discussed above. Example B provides a surface with good ductility and lower but acceptable hardness at 11.3 Gpa but a lower deposition rate of 3 μm/hr. The scratch resistance is, however, particularly good at 14.8 N. and the bias voltage need only be 600 V. Example C provides a surface with good hardness at 17.5 Gpa and an acceptable deposition rate at 2.55 μm/hr but manages to achieve this at a low pressure of just 50 mTorr. Example D very high dep rate of 13.5 um/hr with 7.7 GPa hardness. FIG. 4 also provides as example D the performance data for an example at 200 mTorr and a bias voltage of 2000V (10% DC). The DMA was 0.05 ccm and argon was at 175 based on an adhesion layer of silane in argon at 1700V and 100 mTorr for 10 min with no blend layer. A final tested hardness of 31.1 Gpa and a dep rate of 4.6 μm/hr was achieved. These are by far the best results and illustrate the advantage of greater bias voltages, particularly for external processes. FIG. 4 also provides a example E the performance for a 20 mTorr process, with a bias voltage of 1000V, DMA flow of 0.05 ccm and Ar flow of 175 sccm, using magnets to increase plasma ionization, this produces the hardest coating at 35 GPa with a somewhat reduced deposition rate of 3 um/min. FIG. 4 also provides in example E the performance for a 20 mtorr process, with a bias voltage of 1500V, DMA flow of 0.05 ccm and Ar flow of 200 sccm, using magnets to increase plasma ionization, this produces the hardest coating at 35 GPa with a somewhat reduced deposition rate of 3 microns/min so confirms the advantage of using magnets in such processes. Whilst the data of FIG. 4 is in connection with an external process, one may readily apply the teachings to an internal process to the extent the final coating properties can reasonably be expected to be equally enhanced by the use of adamantane and/or magnets in the deposition process.

Figure 5:
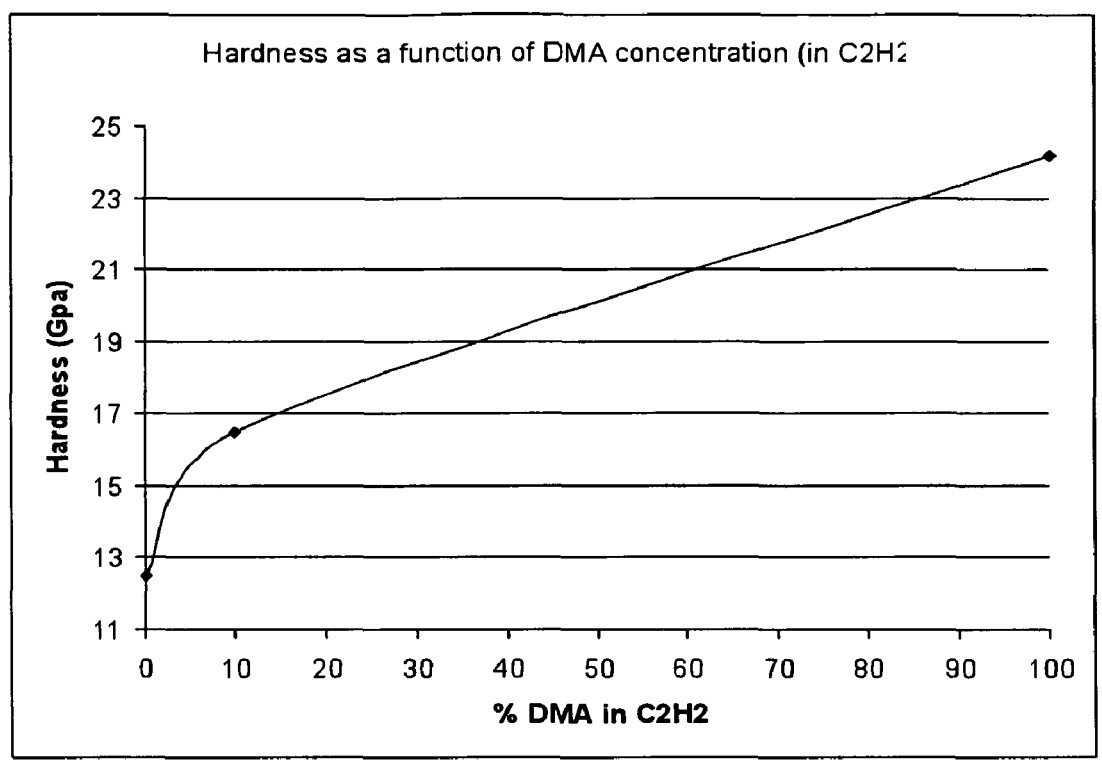
FIG. 5 illustrates the variation in hardness as a function of DMA concentration in C2H2.

FIG. 5 illustrates the established relationship between hardness as a function of DMA concentration in $C_2H_2$ and from which it will be appreciated that the hardness increases rapidly between 0 and 11% DMA but also continues to increase strongly between 11% DMA and 100% DMA. It is this property that is exploited in the present invention. FIG. 6 provides the data from which the graph of FIG. 5 has been drawn.

The reader's attention is now drawn to FIG. 6 which illustrates the coating properties obtained using DMA with Argon as a carrier gas on an internal process employing the hollow cathode effect. Example F which was run with 100% $C_2H_2$/ total reactive gas, with a flow rate of 24 sccm $C_2H_2$ and gave a hardness of 20.9 Gpa and a 12.9 μm/hr dep rate. This can be compared with Example G which employed 100% DMA and produced a hardness of 24.2 Gpa at a much higher dep rate of 21.5 μm/hr. It will, therefore, be appreciated that the addition of the adamantane gives a 20% harder film with a much higher dep rate (67% higher).

FIG. 7 provides data on a DMD coating process and from which it will be appreciated that the DMD process gives an increases deposition process compared to the adamantane process with the same conditions shown in row 1 of FIG. 6 (~32% higher) with a reduced hardness. The reduction in hardness is due to the reduction in ion energy per carbon atom due to the larger molecule size, if the bias voltage was increased for the DMD comparable hardness to the DMA precursor could be obtained.

Figures 8, 9:
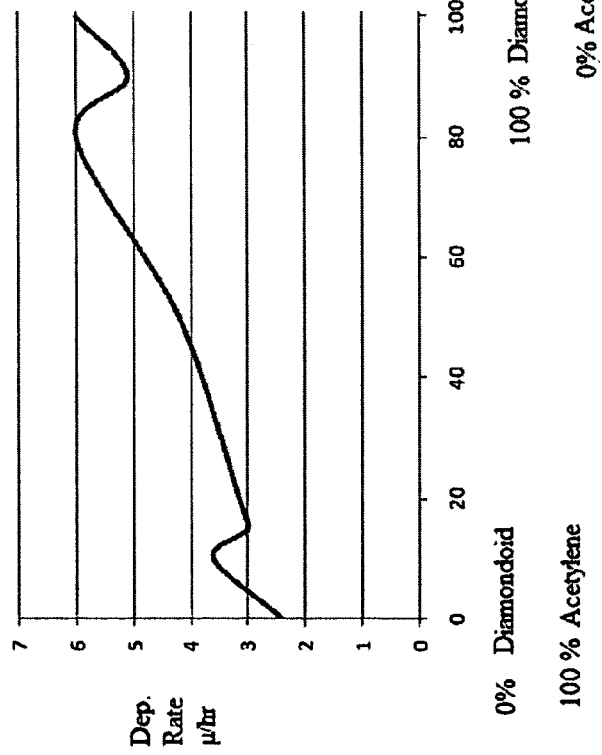
FIG. 8 is a chart of test data for various test conditions in which the percentage diamondoid was varied.
FIG. 9 is a graph of deposition rate associated with the data of FIG. 8.

FIG. 8 provides data from a test conducted to establish the advantages associated with an increase in the percentage diamondoid in the carrier graph for constant pressure and bias voltage conditions. The data of FIG. 8 is represented graphically in FIG. 9 and from which it will be appreciated that there is a significant increase in the deposition rate as the percentage diamondoid is increased. It is also observed that the initial rise and then fall of deposition rate between zero and 15 percent diamondoid is arrested above 20% and a maximum is achieved at approximately 80% before a noticeable fall and then final rise to 6 μ/hr. There may be some advantage to simply selecting 80% rather than 100% diamondoid.

Figure 10:
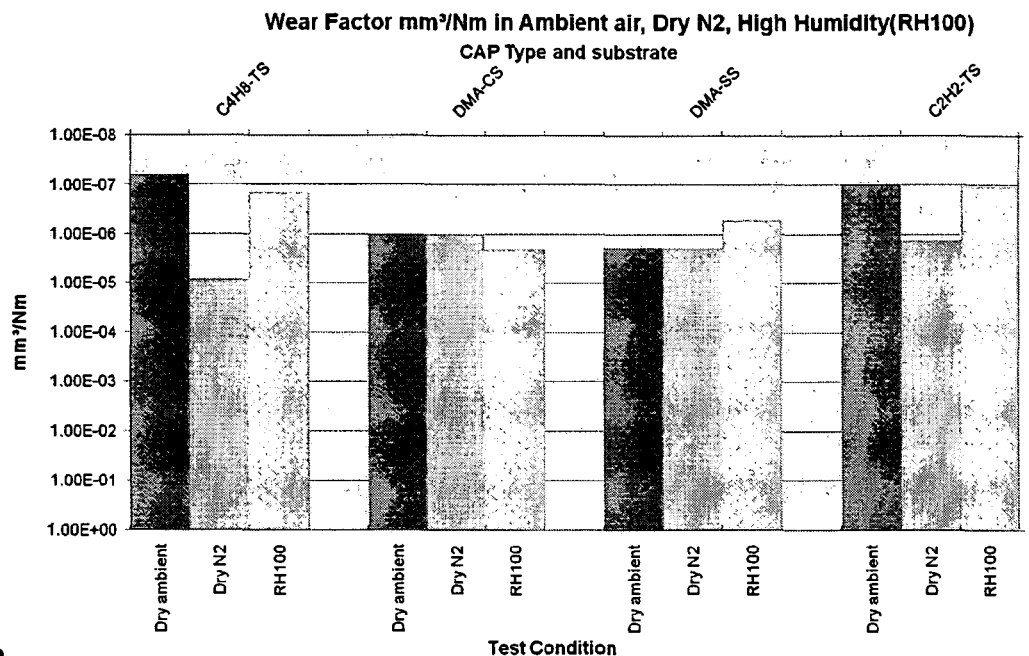
FIG. 10 and FIG. 11 illustrate the wear characteristics of coatings produced in accordance with the present invention as a comparison with prior art processes.
Figure 11:
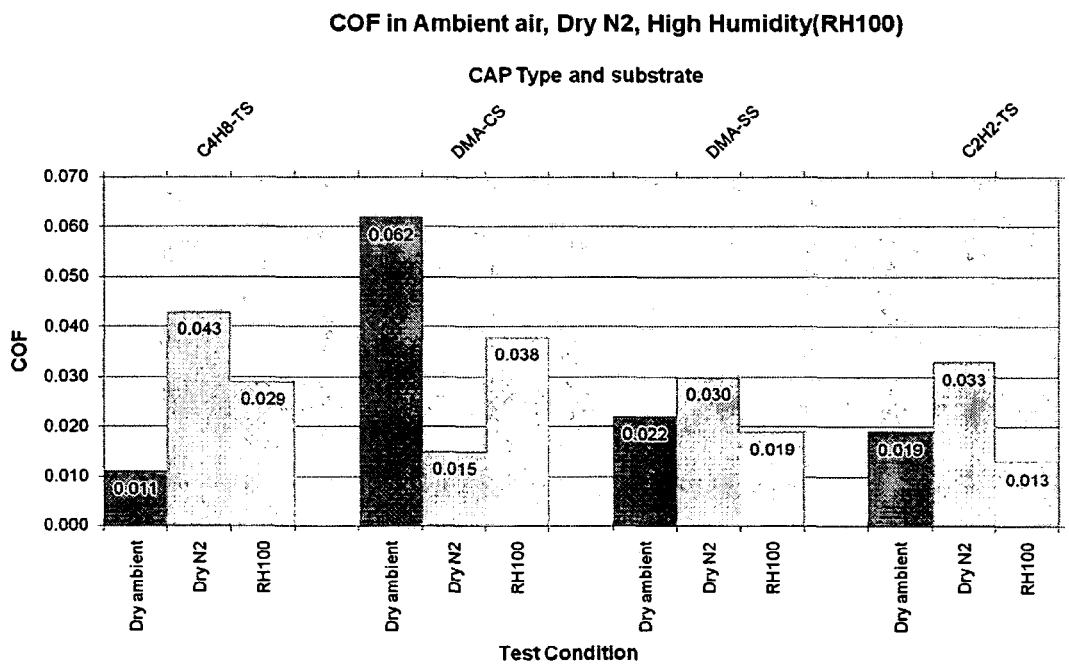

FIG. 10 and FIG. 11 illustrate the wear characteristics of coatings produced with prior art precursors and those of the present invention and from which it will be appreciated that Diamondoid coatings give consistent wear and low COF in dry nitrogen or low humidity environments compared to other DLC's Those skilled in the art will appreciate that the above process may be employed with other precursor materials having high diamondoid structure such as, for example, dimethyl-diamantane and under such circumstances it would be appropriate to employ a higher bias voltage in the region of 1000-to 3000V. It is also known in the art to add a metal to the precursor to add ductility and toughness, and increased electrical conductivity allowing thicker films and such a step may also be employed to advantage in the present invention. The metal may be, for example, tetrakisdimethylamino-titanium (TDMAT). Additionally, introducing the hydrocarbon in the form of $C_2H_2$ or $C_4H_8$ is known and may be employed in the present invention. The process of the present invention may also include a step of layering diamondoid without any other reactive gas and other reactive gases with or without diamondoid to form composite coatings which is known in the art to provide improved ductility, hardness, toughness by layering hard, soft materials many times with superior properties than each material alone. Additionally, adding a dopant to said diamondoid precursor is also desirable and suitable examples include $N_2$, $H_2$, $S_i$, metals, germanium or a metal containing MOCVD precursor such as TDMAT. In some instances the precursor may be alkylated. Composite coatings based on DLC have also been shown to have desirable properties. For example layered films using a material of low modulus followed by a material of high hardness such as WC/C has been shown to increase wear resistance. Similarly, a so called "nano-composite" can be used. A nano-composite is formed by mixing the materials instead of layering, so that nano-sized crystals of a very hard material (e.g. TiN) are embedded in the amorphous DLC matrix. A nano-composite can also involve two or more different amorphous matrixes, such as a C—H matrix and separate metal-metal matrix as described in U.S. Pat. No. 5,786,068 to Dorfman et al. In the prior art, these types of films have not been produced with good results with purely PECVD techniques, but only by PVD or hybrid PVD/PECVD methods. It will also be appreciated that higher bias voltages have been shown to provide further improvements in the coating quality and it will be appreciated that bias voltages of up to 3000V may be employed.

What is claimed is:

1. A method of forming a diamond-like carbon coating by plasma enhanced chemical vapor deposition on an internal surface of a hollow component having an inner surface, the method comprising the steps of:
    (a) creating a reduced atmospheric pressure within a hollow component to be treated;
    (b) introducing a diamondoid precursor gas to the interior of said hollow component;
    (c) establishing a bias voltage between a first electrode and one or more second electrodes, at least one of said one or more second electrodes being externally offset from an opening of said component by a hollow insulator that is attached to said hollow component; and
    (d) establishing a plasma region adjacent an inner surface of said hollow component, said plasma region extending through the hollow insulator;
    wherein said diamondoid precursor gas comprises at least one diamondoid and wherein said pressure and bias voltage are selected such as to cause the deposition of diamond-like carbon on said surface.

2. The method of claim 1 wherein said pressure and bias voltage are above 20 mTorr and 500V respectively.

3. The method of claim 1 including a step of creating the plasma region by means of establishing a hollow cathode effect plasma.

4. The method of claim 1 wherein the deposition rate is greater than 10 μm/hr.

5. The method of claim 1 wherein said precursor is selected from the group consisting of adamantane, diamantane, and triamantane.

6. The method of claim 5 wherein said precursor is alkylated.

7. The method of claim 1 wherein said diamondoid precursor is 1,3 diamethyl-adamantane.

8. The method of claim 1 wherein said adamantane is present as a percentage of between 10% and 100% in another reactive gas.

9. The method of claim 1 wherein the pressure is between 20 mTorr and 300 mTorr and the bias voltage is between 500V and 3000V.

10. The method of claim 1 further comprising the step of introducing a hydrocarbon with the diamondoid precursor.

11. The method of claim 10 wherein the hydrocarbon is in the form of $C_2H_2$ or $C_4H_8$.

12. The method of claim 1 further comprising the step of adding a metal to the precursor.

13. The method of claim 12 wherein said metal is tetrakisdimethylamino-titanium (TDMAT).

14. The method of claim 1 further comprising the step of layering diamondoid without any other reactive gas, and other reactive gases with or without diamondoid, to form composite coatings.

15. The method of claim 1 further comprising the step of adding a dopant to said diamondoid precursor.

16. The method of claim 15 wherein said dopant is selected from the group consisting of $N_2$, silicon, germanium, TDMAT, and other metals containing MOCVD precursor.

17. A method of forming a diamond-like carbon coating on an internal surface of a pipe by plasma enhanced chemical vapor deposition the method comprising the steps of:
    (a) creating a reduced atmospheric pressure within a pipe to be treated;
    (b) introducing a diamondoid precursor gas to the interior of said pipe;
    (c) establishing a bias voltage between a first electrode and one or more second electrodes, each of said one or more second electrodes being externally offset from an opening of said pipe by a respective hollow insulator that is attached to said pipe such that each of said one or more second electrodes is an anode remote from said pipe; and
    (d) establishing a hollow cathode plasma region adjacent said inner surface and extending from said one or more second electrodes through said hollow insulator;
    wherein, said diamondoid precursor gas comprises at least one diamondoid and said pressure and bias voltage are above 20 mTorr and 500V respectively, such as to cause the deposition of diamond-like carbon on said surface.

18. The method of claim 17 further comprising the step of attaching said first electrode to said pipe and biasing said pipe as a cathode and biasing one or more second electrodes as anodes remote therefrom, and establishing a hollow cathode plasma within said pipe.

* * * * *